United States Patent
Chen

(10) Patent No.: US 8,264,258 B1
(45) Date of Patent: Sep. 11, 2012

(54) PHASE LOCK LOOP CIRCUIT

(75) Inventor: Chih-Hung Chen, Kaohsiung (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 13/225,541

(22) Filed: Sep. 5, 2011

(30) Foreign Application Priority Data

May 18, 2011 (TW) .............................. 100117429 A

(51) Int. Cl.
*H03L 7/06* (2006.01)
(52) U.S. Cl. ........................ 327/156; 327/147
(58) Field of Classification Search .................. 327/147, 327/156
See application file for complete search history.

(56) References Cited

U.S. PATENT DOCUMENTS

| | | | | |
|---|---|---|---|---|
| 4,500,851 A | * | 2/1985 | Sawa et al. ........................ 331/2 |
| 5,442,593 A | * | 8/1995 | Woodbury et al. ............ 367/135 |
| 7,098,754 B2 | * | 8/2006 | Humphreys et al. .......... 332/103 |
| 7,786,771 B2 | * | 8/2010 | Tsai et al. ...................... 327/156 |
| 7,973,612 B2 | * | 7/2011 | Raghunathan et al. ........ 331/186 |
| 2006/0012414 A1 | * | 1/2006 | Goldman ....................... 327/291 |
| 2006/0141963 A1 | * | 6/2006 | Maxim et al. ............... 455/192.1 |
| 2007/0103247 A1 | * | 5/2007 | Yokota et al. ................. 331/158 |
| 2008/0068056 A1 | * | 3/2008 | Poulton et al. ................ 327/156 |
| 2009/0039973 A1 | * | 2/2009 | Kitayama et al. ........... 331/36 C |
| 2009/0231002 A1 | * | 9/2009 | Poulton et al. ................ 327/156 |
| 2009/0295439 A1 | * | 12/2009 | Tsai et al. ...................... 327/156 |
| 2010/0264962 A1 | * | 10/2010 | Kitayama et al. ............. 327/156 |

* cited by examiner

*Primary Examiner* — Lincoln Donovan
*Assistant Examiner* — Adam Houston
(74) *Attorney, Agent, or Firm* — Jianq Chyun IP Office

(57) ABSTRACT

A phase lock loop (PLL) circuit having a phase frequency detector (PFD), a coarse tune low-pass filter module, a voltage control oscillation (VCO) module and a feedback loop is provided. The PFD compares phases and frequencies of an input signal and a feedback signal. The coarse tune low-pass filter module is coupled to the PFD and used for low-pass filtering a control signal with a gradually narrowed bandwidth to generate a filtered signal. The control signal indicates the comparison result of the input signal and the feedback signal. The VCO module has a first VCO gain and a second VCO gain, and generates an output signal according to the control signal and the filtered signal. The feedback loop provides the feedback signal to the PFD according to the output signal.

17 Claims, 5 Drawing Sheets

PHASE LOCK LOOP CIRCUIT

CROSS-REFERENCE TO RELATED APPLICATION

This application claims the priority benefit of Taiwan application serial no. 100117429, filed on May 18, 2011. The entirety of the above-mentioned patent application is hereby incorporated by reference herein and made a part of this specification.

BACKGROUND OF THE INVENTION

1. Field of the Invention

The invention relates to a phase lock loop (PLL) circuit. Particularly, the invention relates to a PLL circuit capable of quickly and accurately locking a required frequency and phase.

2. Description of Related Art

Phase lock loop (PLL) circuit has a long history of development process and still plays a key role in technique discussions due to its wide application and high development potential. In brief, a basic function of the PLL circuit is to use an oscillation source with an extremely low variation to serve as a basic reference, and drive a device with a variable frequency under a feedback function of a closed loop control system, so that the frequency of the device is quickly and stably maintained at a same phase with the oscillation source, i.e. the frequency is phase locked.

Moreover, most of the current PLL circuits apply a dual-loop design with a coarse tune loop and a fine tune loop. Under consideration of stability, a large resistor and a large capacitor may be used to construct the coarse tune loop in a typical analog dual-loop PLL, so as to generate a pole at a very low frequency. Moreover, in order to acquire a locking stability, the fine tune loop is often considered in design of a dual-loop PLL. On the other hand, a voltage control oscillator (VCO) having a low frequency gain (Kvco) is usually used in the conventional dual-loop PLL for advantages such as a low phase noise and an excellent power supply rejection ratio (PSRR). However, a problem of a slow locking response speed exists in the conventional dual-loop PLL due to a fixed and excessively limited bandwidth of a coarse tune low-pass filter of the coarse tune loop.

SUMMARY OF THE INVENTION

The invention is directed to a phase lock loop (PLL) circuit capable of quickly and accurately locking a required frequency and phase.

In one aspect, a phase lock loop (PLL) circuit is provided, including a phase frequency detector (PFD), a coarse tune low-pass filter module, a voltage control oscillation (VCO) module and a feedback loop. The PFD compares phases and frequencies of an input signal and a feedback signal. The coarse tune low-pass filter module is used for low-pass filtering a control signal indicating the above comparison result with a gradually narrowed bandwidth to generate a filtered signal. The VCO module is used for generating a first oscillation signal through a first VCO gain according to the control signal and generating a second oscillation signal through a second VCO gain according to the filtered signal, and generating an output signal according to the first oscillation signal and the second oscillation signal. The second VCO gain is higher than the first VCO gain. The feedback loop is used for supplying the feedback signal to the PFD according to the output signal.

In an embodiment, the VCO module includes a first voltage control oscillator, a second voltage control oscillator and a mixer. The first voltage control oscillator has the first VCO gain, and is coupled to the PFD for generating the first oscillation signal according to the control signal. The second voltage control oscillator has the second VCO gain, and is coupled to the coarse tune low-pass filter module for generating the second oscillation signal according to the filtered signal. The mixer is coupled to the first voltage control oscillator and the second voltage control oscillator and is used for mixing the first oscillation signal and the second oscillation signal to generate the output signal.

In an embodiment, the bandwidth of the coarse tune low-pass filter module is narrowed by a predetermined value every a predetermine period.

In an embodiment, the coarse tune low-pass filter module includes a first low-pass filter and a bandwidth controller. The first low-pass filter is coupled to the VCO module and is used for adjusting the bandwidth according to a bandwidth control signal, and low-pass filtering the control signal with the adjusted bandwidth to generate the filtered signal. The bandwidth controller is used to generate and provide the bandwidth control signal to the first low-pass filter to gradually narrow the bandwidth.

In an embodiment, the bandwidth controller includes a timer and a second low-pass filter. The timer is used to generate a trigger signal. The second low-pass filter is used for generating the bandwidth control signal according to the trigger signal.

In an embodiment, the timer generates the trigger signal every a predetermined period, so that the second low-pass filter generates the bandwidth control signal every the predetermined period to instruct the first low-pass filter to narrow the bandwidth.

In an embodiment, the first low-pass filter includes a variable resistor and a capacitor. The variable resistor is coupled to the PFD, and changes a resistance thereof according to the bandwidth control signal. The capacitor is has a first end coupled to a system voltage and a second end coupled to the variable resistor for outputting the filtered signal.

In an embodiment, the PLL circuit further includes a charge pump. The charge pump is coupled to the PFD for generating the control signal according to the comparison result of the PFD.

In an embodiment, the PLL circuit further includes a loop filter. The loop filter is coupled to the charge pump to filter the control signal output by the charge pump for providing to the coarse tune low-pass filter module and the VCO module.

In another aspect, a phase lock loop circuit is also provided, comprising: a phase frequency detector, for receiving an input signal and a feedback signal; a coarse tune low-pass filter module, coupled to the phase frequency detector, operating with a gradually narrowed bandwidth; a voltage control oscillation module, having a first voltage control oscillator coupled to the phase frequency detector, a second voltage control oscillator coupled to the coarse tune low-pass filter module; and a feedback loop, coupled between the voltage control oscillation module and the phase frequency detector.

According to above descriptions, the bandwidth of the coarse tune low-pass filter module of the PLL circuit can be gradually narrowed. When the PLL circuit performs frequency locking, the bandwidth of the coarse tune low-pass filter module can be dynamically varied, enabling the PLL circuit to quickly and accurately lock the frequency of the output signal to a specific frequency.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

In the following embodiments, during an initial stage that a phase lock loop (PLL) circuit begins to perform a locking operation, a coarse tune low-pass filter module is set to have a relatively great bandwidth, so that a frequency of an output signal can be quickly adjusted to be around an expected frequency. Moreover, during a final stage that the PLL circuit almost finish the locking operation, the coarse tune low-pass filter module is set to have a relatively small bandwidth, so that the frequency of the output signal can be accurately adjusted to the expected frequency. As a result, the PPL circuit can quickly and accurately lock the output signal to a specific frequency.

Figure 1:
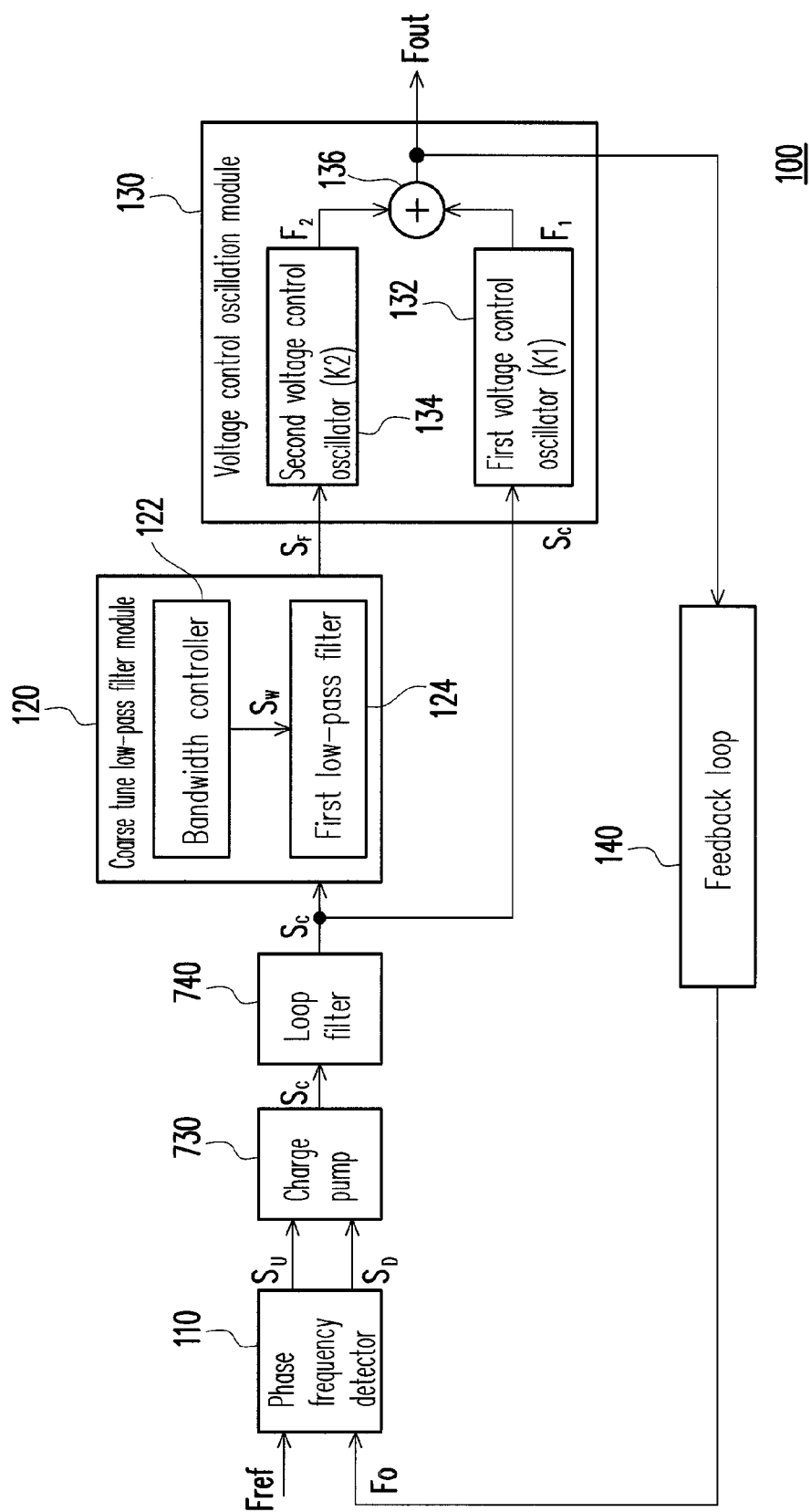
FIG. 1 is a functional block diagram of a phase lock loop (PLL) circuit according to a first embodiment.

Referring to FIG. 1, FIG. 1 is a functional block diagram of a phase lock loop (PLL) circuit 100 according to a first embodiment. A phase frequency detector (PFD) 110 compares phases and frequencies of an input signal Fref and a feedback signal Fo, and generates a boost control signal $S_U$ and a buck control signal $S_D$ according to the comparison result of PFD 110.

A charge pump 730 can be coupled to the PFD 110 for receiving the boost control signal $S_U$ and the buck control signal $S_D$ to generate a control signal $S_C$. In other words, the control signal $S_C$ can indicate the comparison result of the phases and frequencies of the input signal Fref and the feedback signal Fo.

Moreover, according to a design requirement, the PLL circuit 100 may selectively include a loop filter 740. The loop filter 740 can be coupled to the charge pump 730 for filtering the control signal $S_C$ output by the charge pump 730.

The coarse tune low-pass filter module 120 can be coupled to the PFD 110 for receiving the control signal $S_C$ which indicates the comparison result of the PFD 110. As described above, in some embodiments, the coarse tune low-pass filter module 120 can be coupled to the PFD 110 through the charge pump 730, so that the control signal $S_C$ is received from the charge pump 730. In other embodiments, the coarse tune low-pass filter module 120 can be coupled to the PFD 110 through the loop filter 740, so that the control signal $S_C$ is received from the loop filter 740.

The coarse tune low-pass filter module 120 is used for low-pass filtering the control signal $S_C$ with a gradually narrowed bandwidth to generate a filtered signal $S_F$. In other words, when the PLL circuit 100 starts to operate, the bandwidth of the coarse tune low-pass filter module 120 is gradually narrowed.

FIG. 1 also illustrates a detailed structure of the coarse tune low-pass filter module 120 according to an embodiment. As shown in FIG. 1, the coarse tune low-pass filter module 120 includes a first low-pass filter 124 and a bandwidth controller 122, where a bandwidth of the first low-pass filter 124 is the aforementioned gradually narrowed bandwidth of the coarse tune low-pass filter module 120. The first low-pass filter 124 is coupled to the bandwidth controller 122 and is used for receiving a bandwidth control signal $S_W$ from the bandwidth controller 122 and adjusting the bandwidth according to the bandwidth control signal $S_W$. In other words, under the control of the bandwidth control signal $S_W$, the bandwidth of the first low-pass filter 124 (i.e. the bandwidth of the coarse tune low-pass filter module 120) can be gradually narrowed. Moreover, the first low-pass filter 124 may receive the control signal $S_C$, and low-pass filters the control signal $S_C$ with the adjusted bandwidth to generate the filtered signal $S_F$, and further provides the filtered signal $S_F$ to the VCO module 130.

The VCO module 130, coupled to the coarse tune low-pass filter module 120 and the charge pump 730 (e.g. through the loop filter 740), is used for generating an output signal Fout according to the control signal $S_C$ and the filtered signal $S_F$. In detail, the VCO module 130 generates a first oscillation signal $F_1$ through a first VCO gain K1 according to the control signal $S_C$. Moreover, the VCO module 130 generates a second oscillation signal $F_2$ through a second VCO gain K2 according to the filtered signal $S_F$. Preferably, the second VCO gain K2 is higher than the first VCO gain K1, and more preferably, the second VCO gain K2 is far higher than the first VCO gain K1. The VCO module 130 generates the output signal Fout according to the first oscillation signal $F_1$ and the second oscillation signal $F_2$.

FIG. 1 also illustrates a detailed structure of the VCO module 130 according to an embodiment. As shown in FIG. 1, the VCO module 130 may include a first voltage control oscillator 132, a second voltage control oscillator 134 and a mixer 136. The first voltage control oscillator 132 has the first VCO gain K1, and is coupled to the PFD 110 for generating the first oscillation signal $F_1$ according to the control signal $S_C$. The second voltage control oscillator 134 has the second VCO gain K2, and is coupled to the coarse tune low-pass filter module 120 for generating the second oscillation signal $F_2$ according to the filtered signal $S_F$. The mixer 136 is coupled to the first voltage control oscillator 132 and the second voltage control oscillator 134 and is used for mixing the first oscillation signal $F_1$ and the second oscillation signal $F_2$ to generate the output signal Fout. A frequency of the output signal Fout is equal to a sum of a frequency of the first oscillation signal $F_1$ and a frequency of the second oscillation signal $F_2$.

The VCO module 130 is further coupled to the PFD 110 through a feedback loop 140. The feedback loop 140 can be coupled between the VCO module 130 and the PFD 110, used for supplying the feedback signal Fo to the PFD 110 according to the output signal Fout.

It should be noticed that in the embodiment of FIG. 1, the output signal Fout and the feedback signal Fo are the same signal. However, the invention is not limited thereto, and in other embodiments, the feedback loop 140 includes one or more frequency dividers, and the feedback signal Fo can be generated by frequency dividing the output signal Fout through the frequency divider(s) of the feedback loop 140.

Under the above configuration, when a frequency and a phase of the input signal Fref are different to those of the feedback signal Fo, the PFD 110 can adjust the frequency and the phase of the feedback signal Fo generated by the VCO module 130 by changing a potential of the control signal $S_C$, so as to close the frequency and the phase of the feedback signal Fo to those of the input signal Fref, and finally equalize the frequencies and the phases of the feedback signal Fo and the input signal Fref to complete locking the output signal Fout and the feedback signal Fo.

In detail, the PFD 110 can compare the phases and frequencies of the input signal Fref and the feedback signal Fo, and adjust the potential of the control signal $S_C$ according to the comparison result, and then the VCO module 130 changes the frequency of the first oscillation signal F1. Moreover, as the coarse tune low-pass filter module 120 low-pass filters the control signal $S_C$ to generate the filtered signal $S_F$, the potential of the filtered signal $S_F$ is correlated with the potential of the control signal $S_C$ in a certain degree. Therefore, when the potential of the control signal $S_C$ is changed, the potential of the filtered signal $S_F$ is accordingly changed, and accordingly the frequency of the second oscillation signal $F_2$ is changed through the VCO 130. As a result, by adjusting the potential of the control signal $S_C$, the frequencies of the first oscillation signal $F_1$ and the second oscillation signal $F_2$ can be simultaneously changed, so as to change the frequency and the phase of the feedback signal Fo. By repeating the above adjustment, the frequency and the phase of the feedback signal Fo can be close to the frequency and the phase of the input signal Fref, so as to finally lock the output signal Fout and the feedback signal Fo.

It should be noted that since the coarse tune low-pass filter module 120 has the gradually narrowed bandwidth, the PLL circuit 100 can quickly and accurately lock the feedback signal Fo to a specific frequency, and a principle thereof is described in detail below.

During the process that the PLL circuit 100 locks the frequency and the phase of the feedback signal Fo, a locking response speed thereof is correlated with the bandwidth of the coarse tune low-pass filter module 120. In detail, the greater the bandwidth of the coarse tune low-pass filter module 120 is, the faster the locking response speed of the PLL circuit 100 is, and the lower a locking accuracy is. Comparatively, the smaller the bandwidth of the coarse tune low-pass filter module 120 is, the slower the locking response speed of the PLL circuit 100 is, and the higher the locking accuracy is.

In the present embodiment, after the PLL circuit 100 starts to operate, the bandwidth of the coarse tune low-pass filter module 120 is gradually narrowed. In this way, during an initial stage that the PLL circuit 100 locks the feedback signal Fo, since the coarse tune low-pass filter module 120 has a greater bandwidth, the frequency of the feedback signal Fo can be quickly adjusted to be around the frequency of the input signal Fref. During a final stage that the PLL circuit 100 locks the feedback signal Fo, since the coarse tune low-pass filter module 120 has a narrower bandwidth, the frequency of the feedback signal Fo can be accurately adjusted to the frequency of the input signal Fref. As a result, the PLL circuit 100 can quickly and accurately lock the feedback signal Fo to a specific frequency.

It should be noticed that the detailed structure shown in FIG. 1 is only used for describing an exemplary embodiment, and other different circuits can also be used to implement the VCO 130 as long as two oscillation signals can be generated according to the control signal $S_C$ and the filtered signal $S_F$, and the output signal Fout can be generated according to the two oscillation signals.

Figure 2:
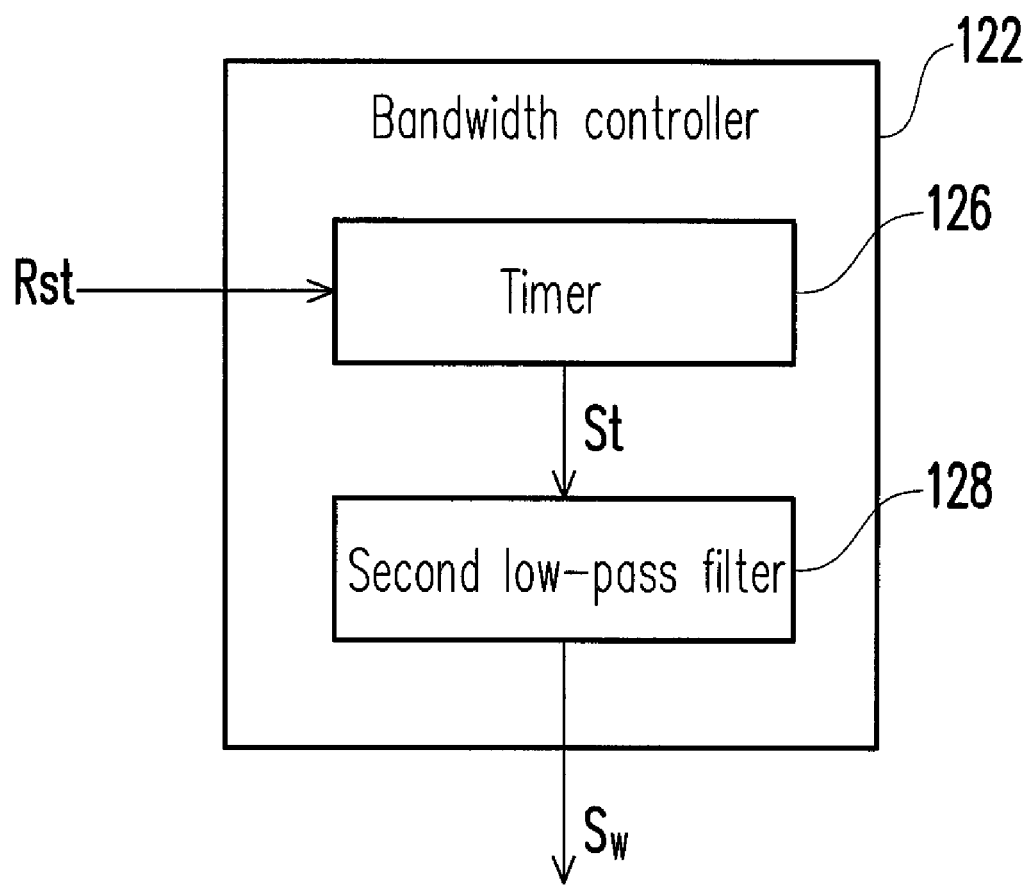
FIG. 2 is a functional block diagram of a bandwidth controller according to an embodiment.

Referring to FIG. 2, FIG. 2 is a functional block diagram of the bandwidth controller 122 according to an embodiment. In the present embodiment, the bandwidth controller 122 includes a timer 126 and a second low-pass filter 128. The timer 126 is used to generate a trigger signal St. The second low-pass filter 128 is coupled to the timer 126 and is used for generating the bandwidth control signal $S_W$ according to the trigger signal St.

Moreover, preferably, the timer 126 generates the trigger signal St every a predetermined period (for example, 50 ms), so that the second low-pass filter 128 narrows the bandwidth of the first low-pass filter 124 every the predetermined period. In this way, the bandwidth of the first low-pass filter 124 can be gradually decreased. Moreover, such operation can be performed until the bandwidth of the first low-pass filter 124 is narrowed to a predetermined minimum bandwidth. It should be noticed that the present invention is not limited thereto, and the predetermined period and the predetermined minimum bandwidth can be set according to an actual design requirement.

In order to implement the aforementioned operation method, in an embodiment, the timer 126 can be set to generate the trigger signal St every the predetermined period, so as to trigger the second low-pass filter 128 to generate the bandwidth control signal $S_W$ every the predetermined period. Each time when the first low-pass filter 124 receives the bandwidth control signal $S_W$, the bandwidth thereof is decreased by the predetermined value. As a result, the bandwidth of the first low-pass filter 124 (i.e. the bandwidth of the coarse tune low-pass filter module 120) is decreased by the predetermined value every the predetermined period.

It should be noticed that the timer 126 can be reset to facilitate the PLL circuit 100 to relock the input signal Fref and the feedback signal Fo. For example, in an embodiment, when the timer 126 receives a reset signal Rst, it generates a corresponding trigger signal St, and the second low-pass filter 128 generates a corresponding bandwidth control signal $S_W$ to restore the bandwidth of the first low-pass filter 124 to an original state that is not narrowed. When the timer 126 is reset, the second low-pass filter 128 can be again triggered to narrow the bandwidth of the first low-pass filter 124.

Figure 3:
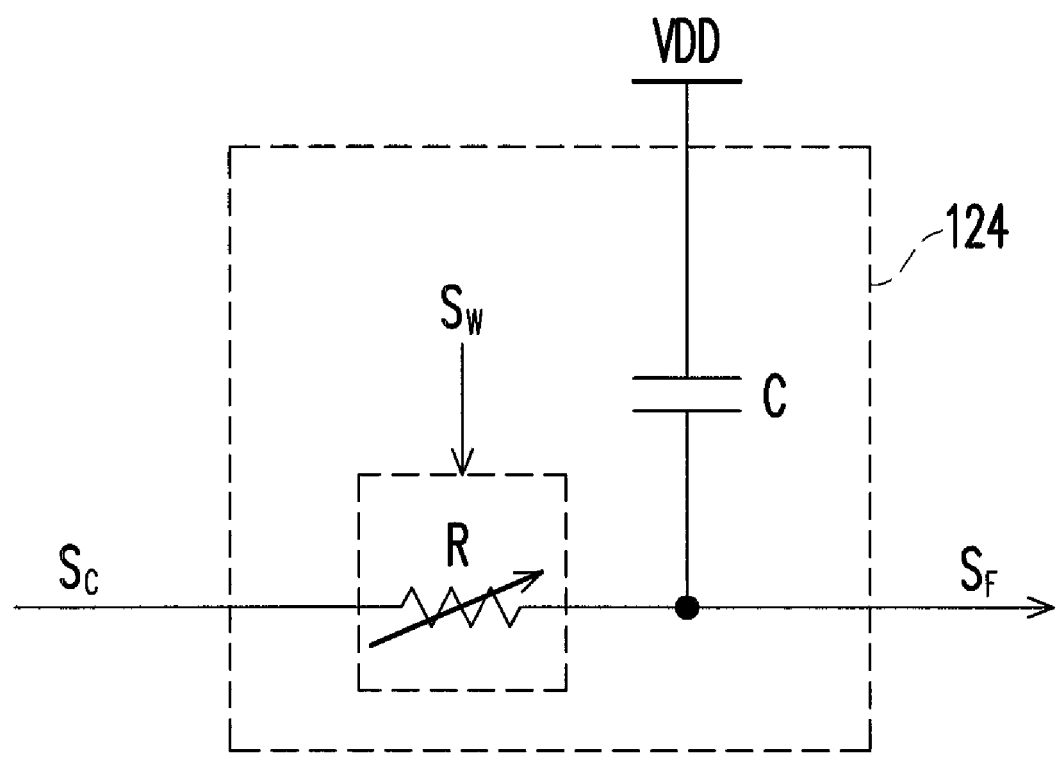
FIG. 3 is a circuit diagram of a first low-pass filter according to an embodiment.

Referring to FIG. 3, FIG. 3 is a circuit diagram of the first low-pass filter 124 according to an embodiment of the invention. The first low-pass filter 124 includes a variable resistor R and a capacitor C. The variable resistor R is coupled to the PFD 110. A first end of the capacitor C is coupled to a first system voltage VDD, and a second end of the capacitor C is coupled to the variable resistor R for outputting the filtered signal $S_F$. Under such a configuration, the bandwidth controller 122 can transmit the bandwidth control signal $S_W$ to the first low-pass filter 124 to change a resistance of the variable resistor R, so as to narrow the bandwidth of the first low-pass filter. In other words, the variable resistor R changes the resistance thereof according to the bandwidth control signal $S_W$.

Figure 4:
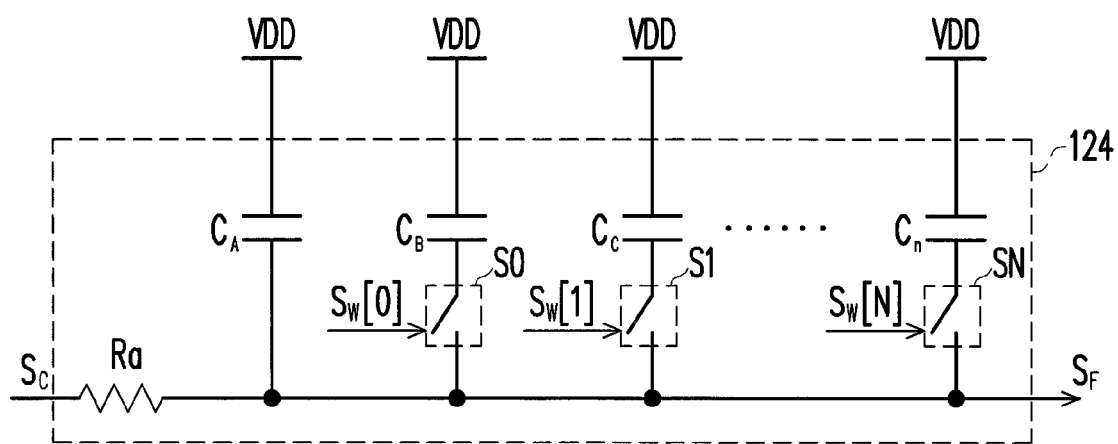
FIG. 4 is a circuit diagram of a first low-pass filter according to another embodiment.

Referring to FIG. 4, FIG. 4 is a circuit diagram of the first low-pass filter 124 according to another embodiment. In the present embodiment, the first low-pass filter 124 includes a resistor Ra, a plurality of capacitors $C_A$-$C_n$ and a plurality of switches S0-SN. The resistor Ra is coupled to the PFD 110. A first end of each of the capacitors $C_A$-$C_n$ is coupled to the first system voltage VDD, a second end of the capacitor $C_A$ is coupled to the resistor Ra, and second ends of the capacitors $C_B$-$C_n$ are coupled to the resistor Ra through the switches S0-SN. In the present embodiment, the bandwidth control signal $S_W$ is a digital control signal of (N+1) bits, each of which is used to control one of the switches S0-SN. For example, a bit $S_W[0]$ is used to control the switch S0, a bit $S_W[1]$ is used to control the switch S1, and a bit $S_W[N]$ is used to control the switch SN. By turning on/off the switches S0-SN, a whole equivalent capacitance of the capacitor $C_A$-$C_n$ is changed, so as to change the bandwidth of the first low-pass filter 124.

It should be noticed that the first low-pass filters 124 of FIG. 3 and FIG. 4 are only two of various first low-pass filters of the PLL circuit of the invention, and the invention is not limited thereto. For example, the embodiments of FIG. 3 and FIG. 4 can be combined, and those skilled in the art should understand that the first low-pass filter can also be implemented by other circuit designs.

Figure 5:
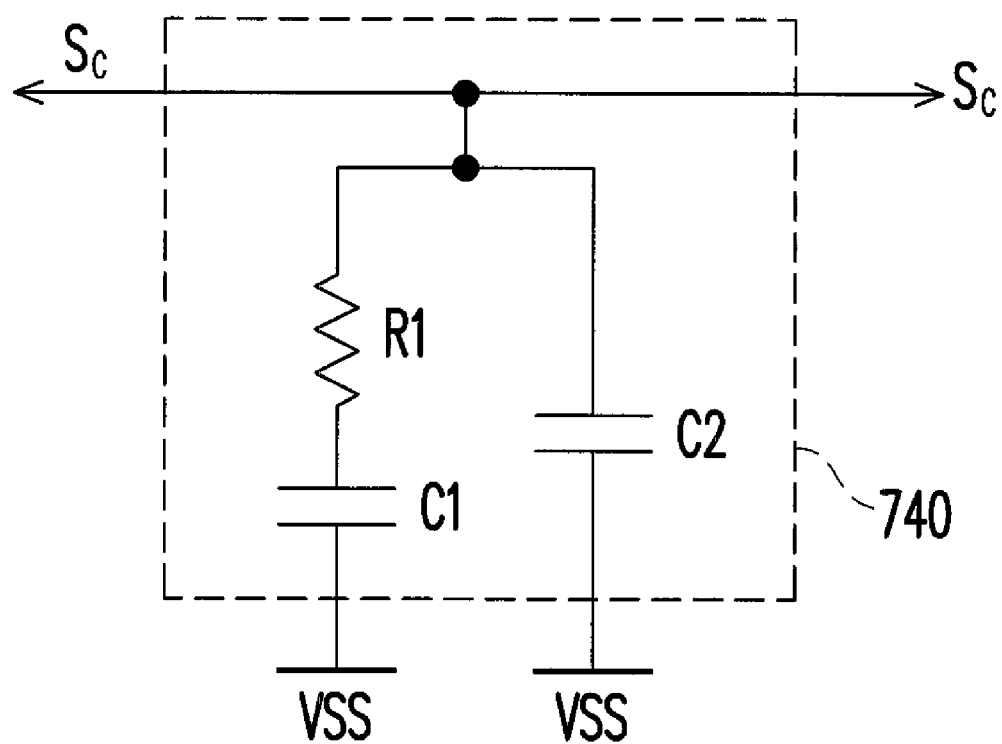
FIG. 5 is a circuit diagram of a loop filter of the PLL circuit according to an embodiment.

Referring to FIG. 5, FIG. 5 is a circuit diagram of the loop filter 740 of the PLL circuit according to an embodiment. In the present embodiment, the loop filter 740 has a resistor R1, a first capacitor C1 and a second capacitor C2 to form a resistor-capacitor (RC) loop. One end of the first capacitor C1 and one end of the second capacitor C2 are coupled to a second system voltage VSS, another end of the first capacitor C1 is coupled to one end of the resistor R1, another other end of which is further coupled to the charge pump 730. A function of the loop filter 740 is to low-pass filter the control signal $S_C$ output by the charge pump 730 to filter high frequency noise in the control signal $S_C$, so as to improve operation stability of the VCO module 130. It should be noticed that the loop filter 740 of FIG. 5 is only one of various low-pass filters that can be used in the PLL circuit of the invention, and the invention is not limited thereto. Those skilled in the art should understand that the low-pass filters of the invention can be implemented by other circuit designs.

In summary, when the PLL circuit of the aforementioned embodiments performs the frequency locking, the bandwidth of the coarse tune low-pass filter module can be dynamically varied and gradually narrowed, so as to quickly and accurately lock the frequency of the output signal to a specific frequency.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A phase lock loop circuit, comprising:
   a phase frequency detector, comparing phases and frequencies of an input signal and a feedback signal;
   a coarse tune low-pass filter module, low-pass filtering a control signal indicating the comparison result with a gradually narrowed bandwidth to generate a filtered signal;
   a voltage control oscillation module, generating a first oscillation signal through a first voltage control oscillation gain according to the control signal and generating a second oscillation signal through a second voltage control oscillation gain according to the filtered signal, and generating an output signal according to the first oscillation signal and the second oscillation signal, wherein the second voltage control oscillation gain is higher than the first voltage control oscillation gain; and
   a feedback loop, supplying the feedback signal to the phase frequency detector according to the output signal.

2. The phase lock loop circuit as claimed in claim 1, wherein the voltage control oscillation module comprises:
   a first voltage control oscillator, having the first voltage control oscillation gain, and coupled to the phase frequency detector for generating the first oscillation signal according to the control signal;
   a second voltage control oscillator, having the second voltage control oscillation gain, and coupled to the coarse tune low-pass filter module for generating the second oscillation signal according to the filtered signal; and
   a mixer, coupled to the first voltage control oscillator and the second voltage control oscillator, for mixing the first oscillation signal and the second oscillation signal to generate the output signal.

3. The phase lock loop circuit as claimed in claim 1, wherein the bandwidth of the coarse tune low-pass filter module is narrowed by a predetermined value every a predetermine period.

4. The phase lock loop circuit as claimed in claim 1, wherein the coarse tune low-pass filter module comprises:
   a first low-pass filter, coupled to the voltage control oscillation module for adjusting the bandwidth according to a bandwidth control signal, and low-pass filtering the control signal with the adjusted bandwidth to generate the filtered signal; and
   a bandwidth controller, generating and providing the bandwidth control signal to the first low-pass filter to gradually narrow the bandwidth.

5. The phase lock loop circuit as claimed in claim 4, wherein the bandwidth controller comprises:
   a timer, generating a trigger signal; and
   a second low-pass filter, generating the bandwidth control signal according to the trigger signal.

6. The phase lock loop circuit as claimed in claim 5, wherein the timer generates the trigger signal every a predetermined period, so that the second low-pass filter generates the bandwidth control signal every the predetermined period to instruct the first low-pass filter to narrow the bandwidth.

7. The phase lock loop circuit as claimed in claim 4, wherein the first low-pass filter comprises:
   a variable resistor, coupled to the phase frequency detector, and changing a resistance thereof according to the bandwidth control signal; and
   a capacitor, having a first end coupled to a system voltage and a second end coupled to the variable resistor for outputting the filtered signal.

8. The phase lock loop circuit as claimed in claim 1, further comprising a charge pump coupled to the phase frequency detector for generating the control signal according to the comparison result of the phase frequency detector.

9. The phase lock loop circuit as claimed in claim 8, further comprising a loop filter coupled to the charge pump to filter the control signal output by the charge pump for providing to the coarse tune low-pass filter module and the voltage control oscillation module.

10. A phase lock loop circuit, comprising:
   a phase frequency detector;
   a coarse tune low-pass filter module, coupled to the phase frequency detector, operating with a gradually narrowed bandwidth;
   a voltage control oscillation module, having a first voltage control oscillator coupled to the phase frequency detector, and a second voltage control oscillator coupled to the coarse tune low-pass filter module; and
   a feedback loop, coupled between the voltage control oscillation module and the phase frequency detector.

11. The phase lock loop circuit as claimed in claim 10, wherein the first voltage control oscillator has a first voltage control oscillation gain, and the second voltage control oscillator has a second voltage control oscillation gain higher than the first voltage control oscillation gain.

12. The phase lock loop circuit as claimed in claim 10, wherein the voltage control oscillation module further comprises a mixer coupled to the first voltage control oscillator and the second voltage control oscillator.

13. The phase lock loop circuit as claimed in claim 10, further comprising a charge pump coupled to the phase frequency.

14. The phase lock loop circuit as claimed in claim 13, further comprising a loop filter coupled between the charge pump and the coarse tune low-pass filter module, and between the charge pump and the first voltage control oscillator of the voltage control oscillation module.

15. The phase lock loop circuit as claimed in claim 10, wherein the bandwidth of the coarse tune low-pass filter module is narrowed by a predetermined value every a predetermine period.

16. The phase lock loop circuit as claimed in claim 10, wherein the coarse tune low-pass filter module comprises:
 a first low-pass filter, coupled to the voltage control oscillation module for adjusting the bandwidth according to a bandwidth control signal; and
 a bandwidth controller, generating and providing the bandwidth control signal to the first low-pass filter.

17. The phase lock loop circuit as claimed in claim 16, wherein the bandwidth controller comprises:
 a timer, generating a trigger signal; and
 a second low-pass filter, generating the bandwidth control signal according to the trigger signal.

* * * * *